United States Patent
Brown et al.

(10) Patent No.: US 7,676,716 B2
(45) Date of Patent: Mar. 9, 2010

(54) TESTABLE TRISTATE BUS KEEPER

(75) Inventors: Jeffrey S. Brown, Fort Collins, CO (US); Mark F. Turner, Longmont, CO (US); Marek J. Marasch, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 55 days.

(21) Appl. No.: 12/169,216

(22) Filed: Jul. 8, 2008

(65) Prior Publication Data
US 2010/0007371 A1    Jan. 14, 2010

(51) Int. Cl.
*G01R 31/28* (2006.01)
*H03K 3/289* (2006.01)

(52) U.S. Cl. .......................... 714/724; 714/47; 714/48; 714/742; 327/202; 327/203

(58) Field of Classification Search .............. 326/56–58; 327/200–218; 714/47–48, 51, 724, 735, 714/736, 742
See application file for complete search history.

(56) References Cited

U.S. PATENT DOCUMENTS

| | | | | |
|---|---|---|---|---|
| 5,717,700 A | * | 2/1998 | Crouch et al. | 714/726 |
| 5,719,879 A | * | 2/1998 | Gillis et al. | 714/726 |
| 6,864,733 B2 | * | 3/2005 | Anshumali et al. | 327/210 |
| 7,234,089 B2 | * | 6/2007 | Morton | 714/726 |
| 7,523,371 B2 | * | 4/2009 | Mitra et al. | 714/729 |
| 7,548,102 B2 | * | 6/2009 | Ramaraju et al. | 327/202 |

* cited by examiner

*Primary Examiner*—Vibol Tan
(74) *Attorney, Agent, or Firm*—Luedeka, Neely & Graham, P.C.

(57) ABSTRACT

A method of testing a tristate element by applying a given value to the tristate, applying an opposite value to a keeper element connected at an output of the tristate, capturing a first value at a downstream position of the tristate, evaluating a second value at the output of the tristate using the first value, comparing the second value to the opposite value, and producing a failure code for the tristate when the second value is not equal to the opposite value. Then, applying the opposite value to the tristate, applying the given value to the keeper element, capturing the first value, evaluating the second value using the first value, comparing the second value to the given value, and producing a failure code for the tristate when the second value is not equal to the given value. A passing code for the tristate is produced when a failure code has not been produced.

4 Claims, 4 Drawing Sheets

TESTABLE TRISTATE BUS KEEPER

FIELD

This invention relates to the field of integrated circuit design. More particularly, this invention relates to an integrated circuit design that facilitates automated testing of tristate buffers.

BACKGROUND

One gate element often used in integrated circuit designs is a tristate buffer. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices. Tristate buffers are active gate devices that produce as an output one of three logic states, being a logical high, a logical low, and no output at all, which is the tristate.

Tristate buffers have an input and a control. An active high tristate buffer will pass through the value of the input (be it either high or low) when the control line is in a high state, but will not pass through any value—high or low—when the control line is in a low state. Conversely, an active low tristate buffer will pass through the value of the input when the control line is in a low state, but will not pass through any value when the control line is in a high state.

Integrated circuits are typically functionally tested using advanced equipment called automated test pattern generators. Automated test pattern generators test an integrated circuit by finding a test sequence that enables the tester to distinguish between correct integrated circuit behavior and faulty integrated circuit behavior that is caused by defects.

Unfortunately, for a variety of reasons, tristate busses in a traditional integrated circuit design cannot be tested via automated test pattern generators for the ability of all of the tristate drivers to enter a tristate state.

What is needed, therefore, is an integrated circuit design that enables an automated test pattern generator to more fully test the proper operation of tristate busses.

SUMMARY

The above and other needs are met by a method of testing a tristate capability of a tristate element by applying a given logical value to an input of the tristate element, applying an opposite of the given logical value to a keeper element that is connected at an output of the tristate element, capturing a first logical value with a latch at a downstream position of the output of the tristate element, evaluating a second logical value at the output of the tristate element using the first logical value, comparing the second logical value to the opposite of the given logical value, and producing a failure code for the tristate element when the second logical value is not equal to the opposite of the given logical value. Then, applying the opposite of the given logical value to the input of the tristate element, applying the given logical value to the keeper element, capturing the first logical value with the latch, evaluating the second logical value at the output of the tristate element using the first logical value, comparing the second logical value to the given logical value, and producing a failure code for the tristate element when the second logical value is not equal to the given logical value. A passing code for the tristate element is produced when a failure code has not been produced.

Thus, the keeper element enables the testing of the tristate element using an automated test pattern generator, in a manner that is not otherwise possible.

According to another embodiment of the invention there is described a method of determining a failure mode of a chain of tristate elements, by applying a given logical value to inputs of the tristate elements, applying an opposite of the given logical value to a keeper element that is connected at an output of the chain of tristate elements, capturing a first logical value at an output of the keeper element, comparing the first logical value to the opposite of the given logical value, producing a failure code for the chain of tristate elements when the first logical value is not equal to the opposite of the given logical value, loading different patterns of logical values into the inputs of the tristate elements to determine which of the different patterns produce failure codes, and determining which of the tristate elements are faulty based at least in part upon the different patterns that produce the failure codes.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
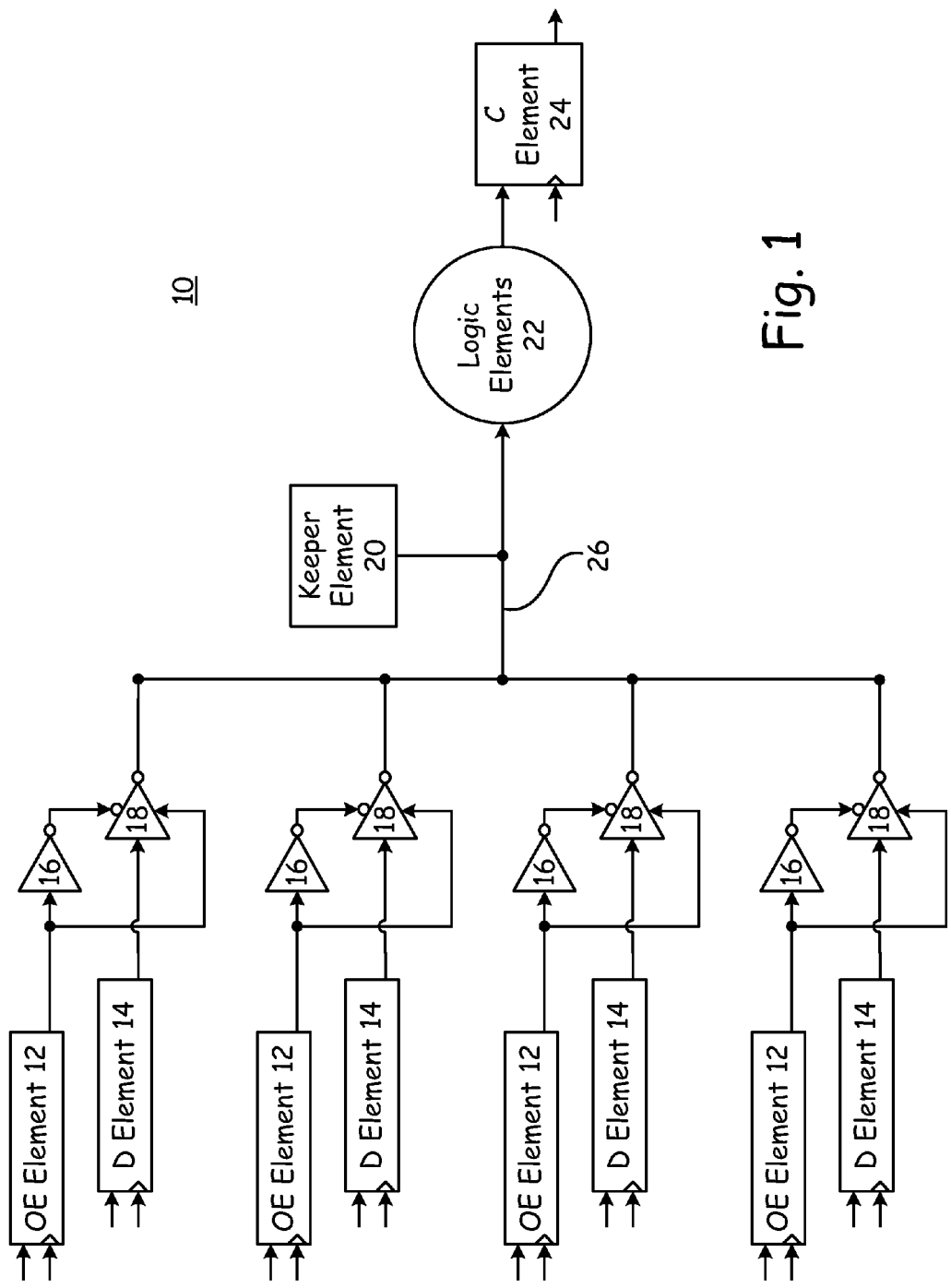
FIG. 1 is an embodiment according to the present invention of an integrated circuit design having a keeper element that enables the tristate drivers to be tested using an automated test pattern generator.

The various embodiments according to the present invention propose a tristate bus keeper 20 that is a scan-able element that can be loaded with a known data value via a scan shift operation. One embodiment of a tristate bus circuit 10 according to the invention is depicted in FIG. 1. The keeper element 20 is a part of the scan chain 10 and is loaded with low data. The D elements 14 are loaded with high data, and the OE elements 12 are loaded such that the tristate bus 26 would not be driven by the D elements 14. Based upon the state captured at the C latch 24, the ability of the tristate bus drivers 18 to be disabled as well as the ability of the keeper device 20 to retain a value can be tested. The complimentary test with the keeper 20 data high and D elements 14 low can also be tested to ensure that the pulldown side of the tristate drivers 18 are disabled.

Figure 2:
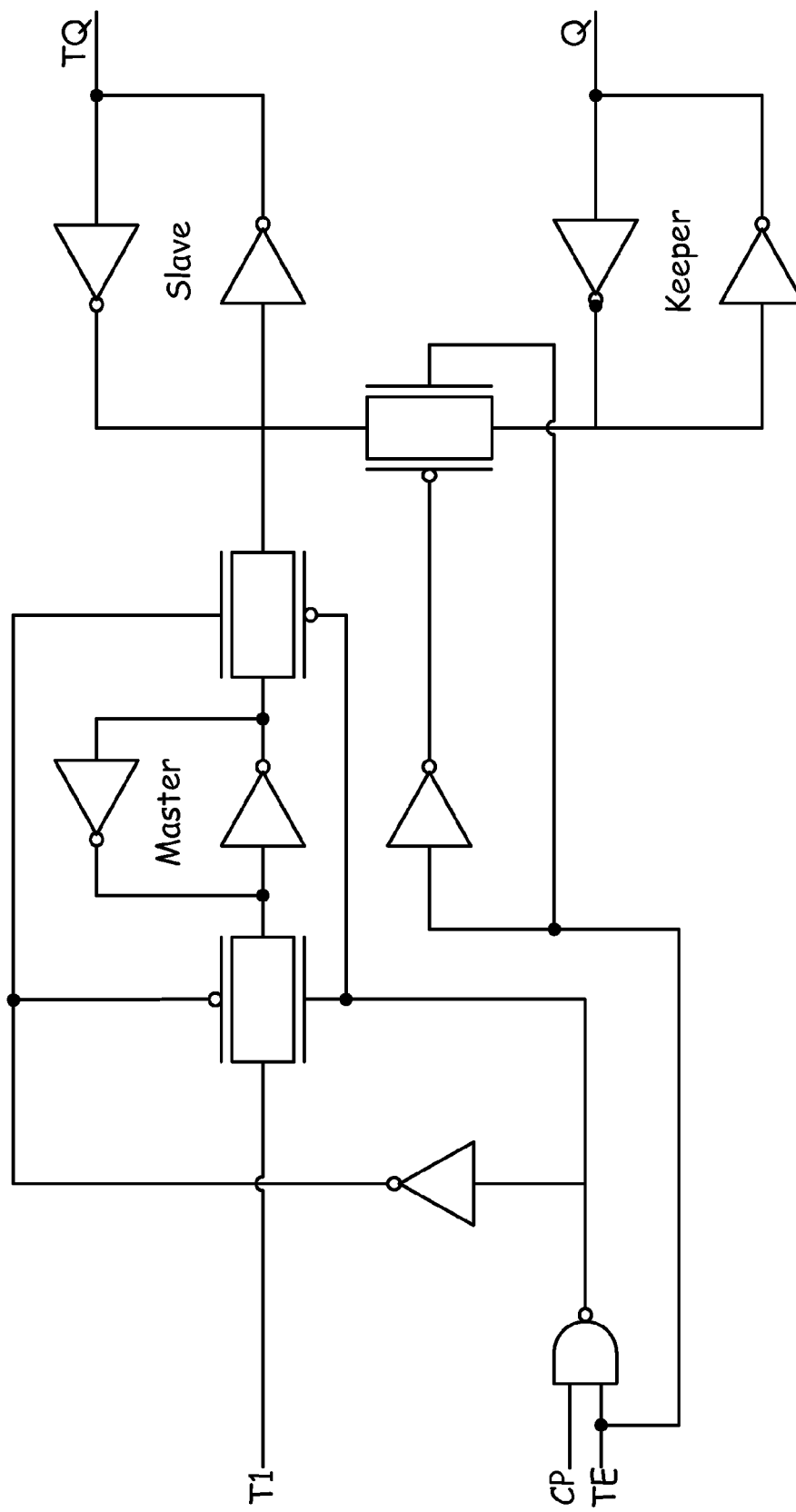
FIG. 2 is an embodiment according to the present invention of a transistor level implementation of a non observable keeper element that enables the tristate drivers to be tested using an automated test pattern generator.

FIG. 2 depicts an embodiment of a transistor level implementation of the scan-able bus keeper 20. Data is loaded into the slave side of the latch on the rising edge of the clock input CP when the test enable input TE is high. This is driven out of the TQ port, which drives the next flop in the scan chain. TE high also loads the data into the keeper latch, which drives port Q. The drive strength out of port TQ is relatively strong, whereas the drive strength out of port Q is relatively weak, and sized appropriately based upon the functional drivers that operate the tristate bus.

The keeper latch 20 can be implemented in many different ways. It is appreciated that FIG. 2 is only meant as an example of a control-only approach to adding scanability to the keeper 20. Observability could also be designed into the bus keeper 20 itself instead of relying on the observation being done downstream at the C element 24, depicted in FIG. 1.

Figure 4:
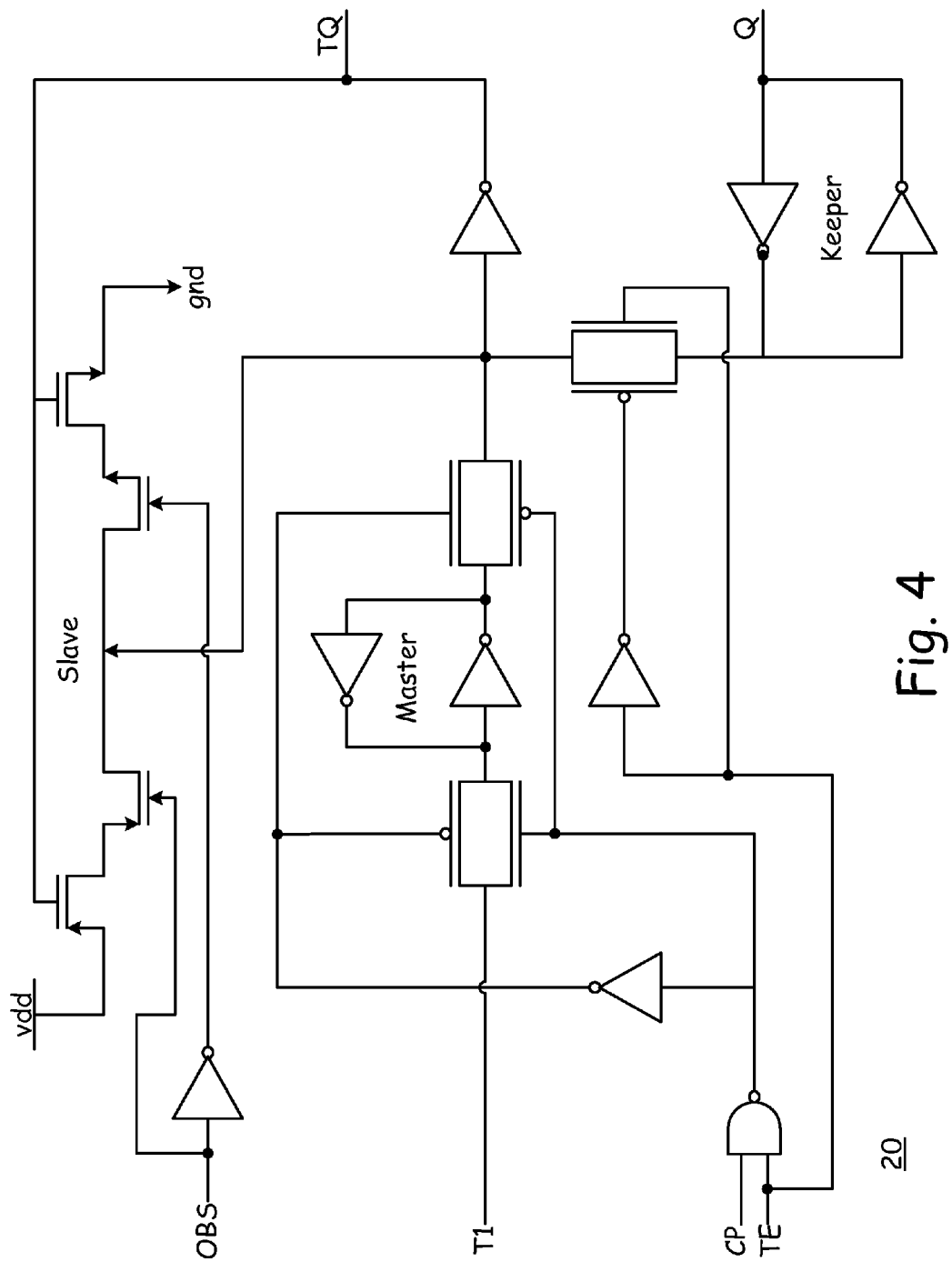
FIG. 4 depicts an embodiment according to the present invention of a transistor level implementation of an observable keeper element that enables the tristate drivers to be tested using an automated test pattern generator.

FIG. 4. is a circuit diagram for the keeper element 20 with observe functionality added. The new OBS pin (observe) is active high in the embodiment as depicted. The feedback inverters in the master loop and keeper loop are weak, which allow them to be overwritten by the passgates that oppose them when they are open. The feedback tristate stack in the slave loop is also weak in comparison to the passgate that opposes it, so that the slave loop can be overwritten by the master-to-slave passgate even when the feedback tristate stack is enabled.

Under normal scan shift operation, data is presented at the TI port, TE high and OBS low. The TI data is allowed to enter the master loop when CP is low. When CP goes high, data is transferred to the slave loop. Since TE is high, the data will also propagate to the keeper loop. When CP returns low, data is held in the slave and keeper loops. At this point, tests are run, and the keeper state will need to be observed to test for pass/fail, as described in more detail below. With CP low and TE low, OBS is asserted high, disabling the feedback in the slave loop. TE is then asserted high, which connects the keeper loop to the slave loop. With the feedback deasserted in the slave loop, the keeper data propagates to the slave loop. OBS is then deasserted low and the keeper data is grabbed into the slave loop and available for scan shift out of the TQ port.

Figure 3:
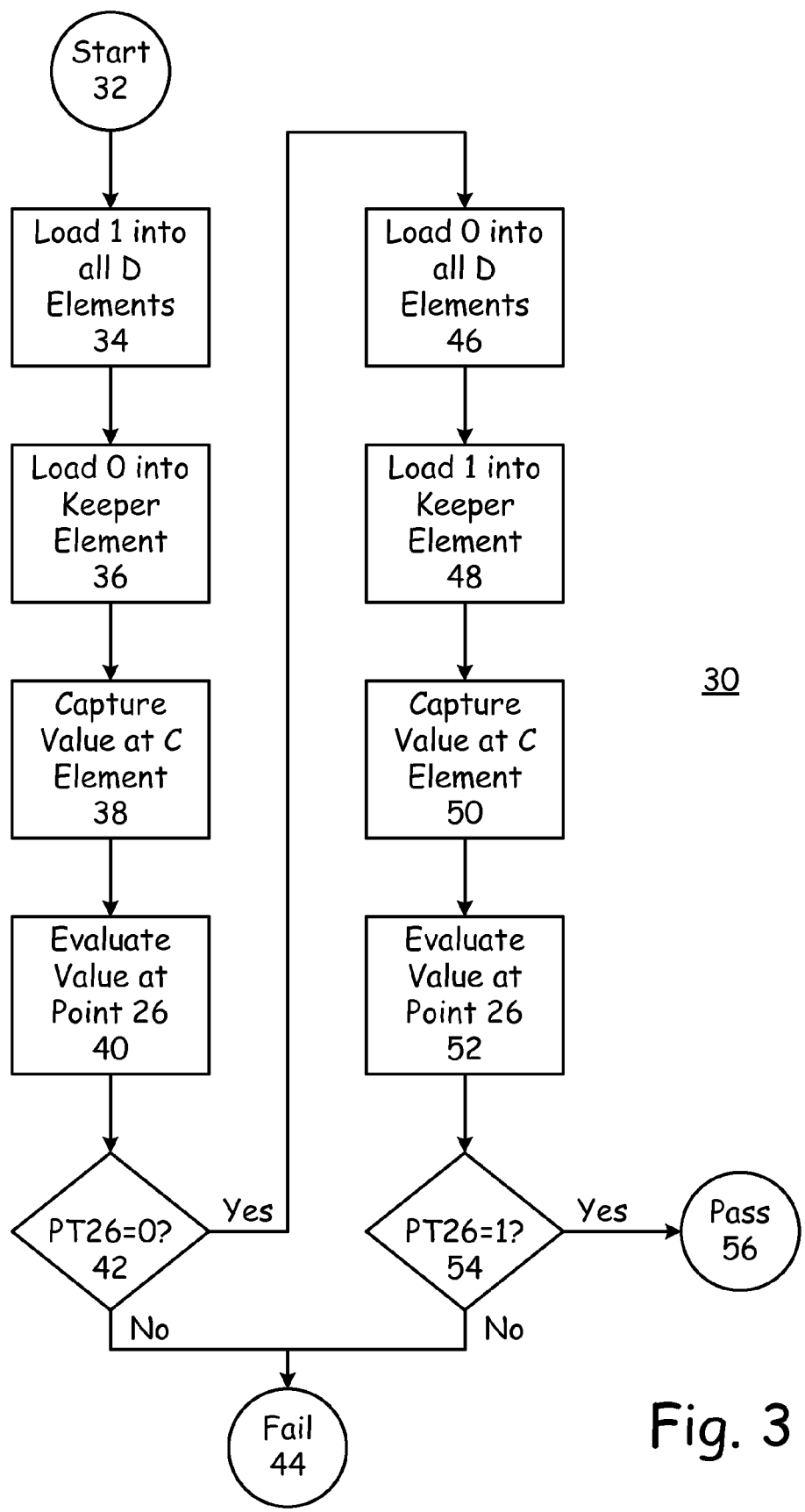
FIG. 3 depicts a flow chart for testing the circuit according to an embodiment of the present invention.

FIG. 3 depicts a flow chart of a method 30 for testing for proper operation of the tristate elements 18 in the circuit 10 of FIG. 1. It is appreciated that the method, while specific for the circuit 10, is intended to be representative and not limiting, and can be adapted to the individual circumstances of specific circuits.

The method 30 starts at 32 by loading a logical high value into all of the D elements 14, as given in block 34 of FIG. 3, which can be accomplished such as through a scan operation. A logical low value is loaded into the keeper element 20, as given in block 36, which again can be accomplished such as through the scan operation. Thus, the D elements 14 and the keeper element 20 are loaded with opposite logical values. The order in which the respective high and low values for the D elements 14 and the keeper element 20 are loaded as described herein is immaterial.

The value is scanned into the keeper element 20, but then the keeper element 20 control is, in effect, turned off. The keeper element 20 likes to stay at a logical high value if it has been set to a high value (or, it likes to stay at a logical low value if it has been set to a low value), once the value (be it high or low) is no longer forced onto the keeper element 20, the keeper element 20 can be overpowered relatively easily (because it is a relatively weak element) by any of the D elements 14 whose output enable is erroneously enabled, such as by some sort of fault in the system, be it a short, bad silicon, or whatever.

The circuit 10 clock or a scan clock is used to capture the value that is output at the C element 24, as given in block 38. The value at point 26 of the circuit 10 is logically evaluated using a standard automated test pattern generator to determine whether it is a logical high or a logical low, as given in block 40. The value at point 26 is then compared to the value of the keeper element 20, as given in block 42, which in the example as depicted in FIG. 3 is a logical low. If the value at point 26 is not correct, then a failure code is generated, as given in block 44. As there are logic elements 22 between point 26 and C element 24, the value at C element 24 will not necessarily equal the value at point 26. However, logically one is able to determine the value at point 26 because the rest of the design within logic 22 is known.

For example, if logic 22 is an XOR gate, then the keeper can be set to a logical low, and all of the D elements 14 can be set to a logical high. By loading up the rest of the design through a scan operation, the other input to the XOR gate can be assured to be a logical high. If a logical low is then captured at C element 24, then point 26 must be at a logical high value, which is different from the logical low value that was loaded into the keeper element 20, which is an indication that at least one of the OE elements 12 is enabled. Of course, logic 22 might be a significantly large number of gates, so standard automatic test pattern generator techniques are used to determine the state at point 26.

If the value at point 26 is the correct value as loaded into the keeper element 20 (in block 36), the flow continues to block 46, where a logical low value (the opposite value as that used in the first half of the process 30) is loaded into all of the D elements 14. Similarly, an opposite logical value, which in the present example is a logical high value, is loaded into the keeper element 20, as given in block 48. Again, the loading operations can be accomplished such as with a scan operation.

Once again, the circuit 10 clock or the scan clock is used to capture the value that is output at the C element 24, as given in block 50. The value at point 26 of the circuit 10 is again logically evaluated using a standard automated test pattern generator to determine whether it is a logical high or a logical low, as given in block 52. The value at point 26 is then compared to the value of the keeper element 20, as given in block 54, which in the example as depicted in FIG. 3 is a logical high. If the value at point 26 is not correct, then a failure code is again generated, as given in block 44. However, if the value is correct, then it has been determined that the tristate elements 18 are tristating correctly, and a pass code is generated as given in block 56.

Determining logically the value at point 26 and at the C Element 24 can be accomplished using the same methods that are traditionally used with a standard automated test pattern generator. If a failure is detected, the root cause can be investigated by loading the keeper element 20 with the value it held at the beginning of the failing pattern, and loading combinations of patterns into the D elements 14 to determine the failing mechanism. For example, if the keeper element 20 is at the same state as all but one of the D elements 14, and the pattern fails, then the single D element 14 with the different state is not tristating properly.

Alternately, many different combinations of D element 14 patterns can be used to isolate the D element 14 values that actually cause a fail condition. For example, if a value of zero that is loaded into the keeper element 20 failed, it would be anticipated that one of the tristated drivers 18 failed to tristate, or if some of the tristate devices 18 were leaky, possibly a failure would be seen when three out of five (for example) of the D elements 14 were set to one. In some instances, it might not even matter which three of the five were set to one. Thus, being able to test combinations of data stored in the D elements 14 after a known failure helps isolate the actual failure mechanism.

Thus, the various embodiments of the present invention provide increased test coverage because of the ability to determine that the tristate drivers 18 on a tristate bus 10 can actually enter a tristate state. Further, the data retention of the tristate keeper 20 can be tested.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of testing a tristate capability of a tristate element, the method comprising the steps of:
   applying a given logical value to an input of the tristate element,
   applying an opposite of the given logical value to a keeper element that is connected at an output of the tristate element,
   capturing a first logical value with a latch at a downstream position of the output of the tristate element,
   evaluating a second logical value at the output of the tristate element using the first logical value,
   comparing the second logical value to the opposite of the given logical value,
   producing a failure code for the tristate element when the second logical value is not equal to the opposite of the given logical value,
   applying the opposite of the given logical value to the input of the tristate element,
   applying the given logical value to the keeper element,
   capturing the first logical value with the latch,
   evaluating the second logical value at the output of the tristate element using the first logical value,
   comparing the second logical value to the given logical value,
   producing a failure code for the tristate element when the second logical value is not equal to the given logical value, and
   producing a passing code for the tristate element when a failure code has not been produced.

2. A method of testing a tristate capability of a tristate element, the method comprising the steps of:
   applying a given logical value to an input of the tristate element,
   applying an opposite of the given logical value to a keeper element that is connected at an output of the tristate element,
   capturing a first logical value at an output of the keeper element,
   comparing the first logical value to the opposite of the given logical value,
   producing a failure code for the tristate element when the first logical value is not equal to the opposite of the given logical value,
   applying the opposite of the given logical value to the input of the tristate element,
   applying the given logical value to the keeper element,
   capturing the first logical value at the output of the keeper element,
   comparing the first logical value to the given logical value,
   producing a failure code for the tristate element when the first logical value is not equal to the given logical value, and
   producing a passing code for the tristate element when a failure code has not been produced.

3. A method of determining a failure mode of a chain of tristate elements, the method comprising the steps of:
   applying a given logical value to inputs of the tristate elements,
   applying an opposite of the given logical value to a keeper element that is connected at an output of the chain of tristate elements,
   capturing a first logical value at an output of the keeper element,
   comparing the first logical value to the opposite of the given logical value,
   producing a failure code for the chain of tristate elements when the first logical value is not equal to the opposite of the given logical value,
   loading different patterns of logical values into the inputs of the tristate elements to determine which of the different patterns produce failure codes, and
   determining which of the tristate elements are faulty based at least in part upon the different patterns that produce the failure codes.

4. A keeper element for use in testing a tristate element, the keeper element comprising a master loop of feedback inverters, a slave loop of feedback inverters, and a keeper loop of feedback inverters, with one passgate disposed between the keeper loop and the slave loop, one passgate disposed between the slave loop and the master loop, and one passgate disposed upstream of the master loop, where the master loop, slave loop, and keeper loop are all weak relative to the passgates, in that a logical value asserted onto any one of the master loop, slave loop, and keeper loop is overwritable by a logical value asserted by a respective one of the passgates, and where a logical value initially propagated from the master loop and the slave loop to the keeper loop is overwritable upon assertion from another source of a differing logical value.

* * * * *